United States Patent
Chung et al.

(10) Patent No.: US 7,689,876 B2
(45) Date of Patent: Mar. 30, 2010

(54) REAL-TIME OPTIMIZED TESTING OF SEMICONDUCTOR DEVICE

(75) Inventors: Ae-yong Chung, Cheonan-si (KR); Hwa-cheol Lee, Cheonan-si (KR); Se-rae Cho, Cheonan-si (KR); Kyeong-seon Shin, Yongin-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 559 days.

(21) Appl. No.: 11/730,792

(22) Filed: Apr. 4, 2007

(65) Prior Publication Data

US 2008/0022167 A1 Jan. 24, 2008

(30) Foreign Application Priority Data

Jun. 30, 2006 (KR) .................. 10-2006-0060662

(51) Int. Cl.
*G06F 11/00* (2006.01)
*G11C 29/00* (2006.01)
*G01R 31/28* (2006.01)
*G01R 31/26* (2006.01)
*G01V 1/00* (2006.01)
*G01V 1/28* (2006.01)

(52) U.S. Cl. .............. 714/704; 714/2; 714/6; 714/25; 714/31; 714/32; 714/37; 714/38; 714/41; 714/47; 714/703; 714/724; 714/718; 714/741; 714/744; 365/201; 324/765; 702/117; 702/118

(58) Field of Classification Search ............. None
See application file for complete search history.

(56) References Cited

U.S. PATENT DOCUMENTS

| 5,235,271 | A  | * | 8/1993 | Kira ............................ 324/765 |
| 5,745,508 | A  | * | 4/1998 | Prohofsky ................... 714/766 |
| 6,223,318 | B1 | * | 4/2001 | Yamashita et al. .......... 714/744 |
| 6,233,701 | B1 | * | 5/2001 | Onoue ......................... 714/33 |
| 6,635,872 | B2 |   | 10/2003 | Davidson |
| 2001/0039486 | A1 | * | 11/2001 | Horie et al. ................. 702/123 |
| 2006/0190206 | A1 | * | 8/2006 | Huang ......................... 702/117 |
| 2006/0190642 | A1 | * | 8/2006 | Aldereguia et al. ........... 710/60 |
| 2006/0198359 | A1 | * | 9/2006 | Fok et al. .................... 370/351 |
| 2006/0212770 | A1 | * | 9/2006 | Fischer et al. ............... 714/742 |
| 2006/0216841 | A1 | * | 9/2006 | Murin et al. ................. 438/17 |

FOREIGN PATENT DOCUMENTS

| JP | 2005-235130 | 9/2005 |
| KR | 1020010029984 A | 4/2001 |
| KR | 102002000599 A | 1/2002 |

* cited by examiner

*Primary Examiner*—Kevin L Ellis
*Assistant Examiner*—Guerrier Merant
(74) *Attorney, Agent, or Firm*—Volentine & Whitt, PLLC

(57) ABSTRACT

A method and system for testing a semiconductor device is disclosed. The method provides an integrated test program defined by a plurality of test items, and a test program defined by a sub-set of the test items. Test data is derived by batch sample testing of the semiconductor device, and an error rate for a test item is computed and then compared to a reference data value. On the basis of the comparison between the error rate and the reference data value, the test program may be modified in real-time.

20 Claims, 6 Drawing Sheets

FIG. 3

| CHARACTERISTIC CLASSIFICATION (110) | TEST ITEM (112) | INTEGRATED TEST PROGRAM (114) | WAFER TEST PROGRAM (116) | PACKAGE TEST PROGRAM (118) | MODULE TEST PROGRAM (120) |
|---|---|---|---|---|---|
| OPEN/ SHORT | (1) SHORT-1 | O | O | O | X |
| | (2) SHORT-2 | O | X | O | O |
| | (3) OPEN | O | O | O | O |
| LEAKAGE | (4) ILKTH | O | O | O | X |
| | (5) ILKTL | O | O | X | X |
| | (6) OLKTH | O | O | O | X |
| | (7) OLKTL | O | O | X | X |
| CURRENT | (8) ICC-0 | O | O | O | X |
| | (9) ICC-1 | O | X | O | X |
| | (10) ICC-2N | O | O | X | O |
| | (11) ICC-2Q | O | X | X | O |
| WL OPEN | (12) XDRW-1 | O | O | O | X |
| | (13) XDRW-2 | O | X | O | X |
| | (14) PAGE DIAG-1 | O | O | X | O |
| | (15) PAGE DIAG-2 | O | O | O | O |
| BL SHORT | (16) 2 ROW (MARCH) | O | O | X | X |
| | (17) MULTI BIT READ | O | O | X | O |
| | (18) MY SAM2 | O | X | O | X |
| | (19) IADC | O | X | O | X |
| WL SHORT | ... | O | O | O | X |
| BL OPEN | ... | O | O | O | X |
| CELL OPEN | ... | O | O | O | X |
| CELL SHORT | ... | O | O | O | X |
| FUNCTION | ... | O | O | O | O |
| AC | ... (N) | O | X | O | O |

FIG. 6

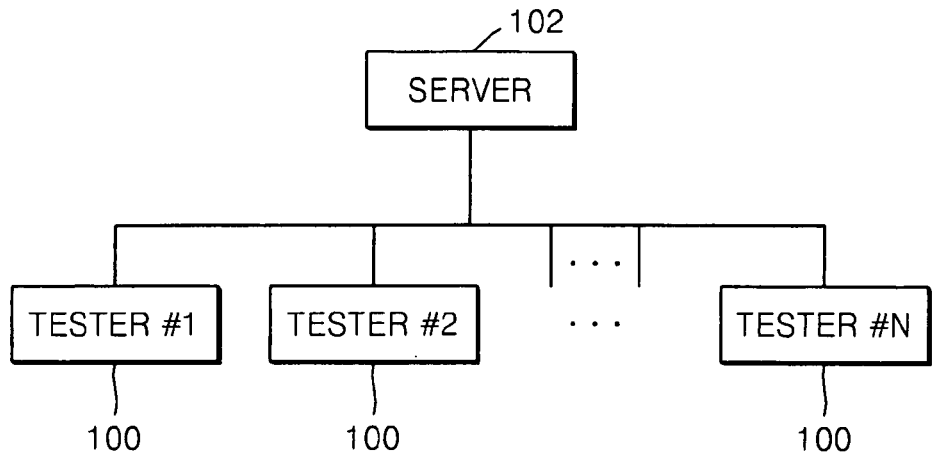

FIG. 7 line 1: K4H560832D-DCxxx (PRODUCT INFORMATION)

line 2: room/hot/cold (TEST TEMPERATURE INFORMATION)

line 3: 4/8/16 (INFORMATION AS TO A NUMBER OF DATA PIECES OF SEMICONDUCTOR DEVICE)

line 4: Fab 10/11/12 (WAFER MANUFACTURING LINE INFORMATION)

line 5: 1,2,3,4,5,...N (TEST ITEM INFORMATION OF INTEGRATED TEST PROGRAM)

line 6: 1,2,5,8,...,N (TEST ITEMS OF SPECIFIC TEST)

line 7: 5,8,...,N (SHMOO TEST ITEMS)

line 8: sever #3 (SERVER INFORMATION OPTIMIZING TEST PROGRAM)

line 9: Sony (SPECIAL DEALER INFORMATION)

US 7,689,876 B2

REAL-TIME OPTIMIZED TESTING OF SEMICONDUCTOR DEVICE

BACKGROUND OF THE INVENTION

1. Field of the Invention

The present invention relates to a testing protocol for a semiconductor device. More particularly, the invention relates to a testing protocol implemented by real-time optimized test program(s) for a semiconductor device and an automated test method using same.

This application claims the benefit of Korean Patent Application No. 10-2006-0060662, filed on Jun. 30, 2006, the subject matter of which is hereby incorporated by reference.

2. Description of the Related Art

Contemporary semiconductor devices are fabricated using an extremely complex sequence of processes. The proper application of these processes as well as the functionality provided by the circuitry formed on semiconductor devices must be systematically verified by numerous sophisticated testing protocols. Functional testing is performed on semiconductor devices on the wafer level, the module level, and package level. In order to provide the necessary efficiency, much of this testing is performed by automatic testing systems using a group of specialized equipment platforms, each generically referred to hereafter as "a tester."

Despite considerable efforts to detect and address problems with semiconductor devices at the wafer level, some latent problems with the functionality of semiconductor devices are only detected once the individual semiconductor dies are packaged by downstream manufacturers. Further, despite testing the additional testing performed by packaging manufacturers some latent quality problems are only detected by consumers of the semiconductor devices, such as end users, retailers, and electronic system or consumer products manufacturers.

Quality problems noted by consumers are highly undesirable for the manufacturer of semiconductor devices and can lead to expensive replacement or repair programs. As a result, semiconductor device manufacturers have expanded and enhanced electrical test programs for semiconductor devices in order to eliminate the possibility of quality programs impacting consumers. Unfortunately, the expansion and enhancement of the electrical test programs lengthens test periods for semiconductor devices.

Indeed, a testing overkill phenomenon may occur. Testing overkill may actually result in the disqualification of acceptable semiconductor devices. Production yields may be unnecessarily impacted and profit margins eroded. Thus, a difficult balance must be struck between adequate testing of semiconductor devices—which is sufficient to identify quality problems, and over-testing of semiconductor devices—which unjustifiably extends testing time and unnecessarily reduces production yields.

Achieving this testing balance requires an iterative engineering approach of running certain tests, analyzing the test results, and modifying the tests in view of the testing results. However, this iterative test development is a lengthy and resource intensive process as engineers must manually edit the automated tests, edit the software programs implementing the tests, compile the edited test programs to implement the programs in execution files, and install the execution files into the automated testing equipment. This conventional approach to the refinement of testing protocols is slow and not well adapted to quickly addressing newly identified quality problems.

SUMMARY OF THE INVENTION

Embodiments of the invention provide a real-time optimized testing protocol for semiconductor devices capable of being run on automated test equipment.

In one embodiment, the invention provides a method of testing a semiconductor device, comprising; providing an integrated test program comprising a plurality of test items, providing a test program defined by a sub-set of test items selected from the plurality of test items, deriving test data by batch sample testing of the semiconductor device, computing an error rate for one of the plurality of test items using the test data, and comparing the error rate to a reference data value, and on the basis of the comparison between the error rate and the reference data value, modifying the sub-set test items defining the test program in real-time.

In another embodiment, the invention provides a test system running software implementing a testing protocol for a semiconductor device, the test system comprising; a server storing and executing the software to control a plurality of testers according to an automated test routine, each one of the plurality of testers being adapted to perform at least one electrical test on the semiconductor device, and the automated test routine implementing an integrated test program comprising a plurality of test items, wherein the software implements a method of testing the semiconductor device comprising; providing a plurality of test programs, each uniquely defined by a respective sub-set of test items selected from the plurality of test items, deriving test data by batch sample testing of the semiconductor device according to the integrated test program, computing an error rate for one of the plurality of test items using the test data, and comparing the error rate to a reference data value, and on the basis of the comparison between the error rate and the reference data value, modifying at least one of the plurality of test programs in real-time.

BRIEF DESCRIPTION OF THE DRAWINGS

Embodiments of the present invention will be described with reference to the attached drawings in which:

FIG. 3 is a table listing test items from an integrated test program and a characteristic test according to an embodiment of the invention;

FIG. 6 is a block diagram of a general semiconductor device test system according to an embodiment of the invention;

FIG. 7 is a diagram illustrating a exemplary test order file defined in relation to the example illustrated in FIG. 1.

DESCRIPTION OF EMBODIMENTS

Embodiments of the invention will now be described with reference to the accompanying drawings. The invention may, however, be embodied in many different forms and should not be construed as being limited to only the illustrated embodiments. Rather, the embodiments are presented as teaching examples.

Figure 1:
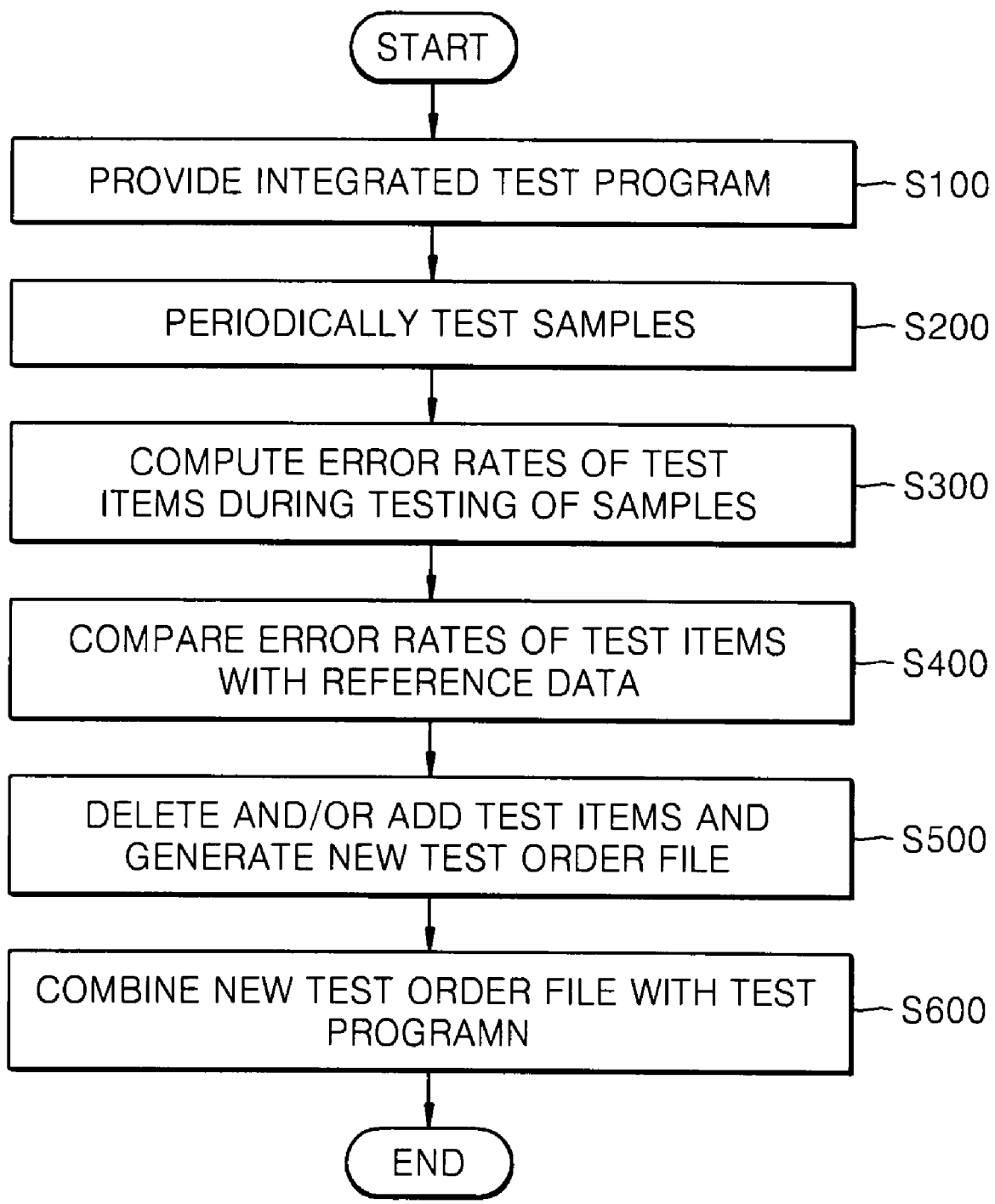
FIG. 1 is a flowchart summarizing a real-time optimized test program designed in accordance with an embodiment of the invention.

FIG. 1 is a flowchart summarizing a real-time optimized test program designed in accordance with an embodiment of the invention. Referring to FIG. 1, an integrated test program adapted to electrically test a semiconductor device is provided (S100). The integrated test program is used to batch test a group of semiconductor devices expected to have common test characteristics. The integrated test program may include any number of specific electrical tests commonly performed to verify the functionality of a semiconductor device. One exemplary integrated test program may include the test items shown in FIG. 3. The integrated test program typically requires a much longer period of time than the electrical tests commonly performed at the wafer, semiconductor package, and/or module stages of manufacture.

Following execution of the integrated test program, sample semiconductor devices are designated and electrically tested at a defined sampling interval (S200). Various sampling intervals (e.g., daily, weekly, monthly, quarterly, etc.) may be defined in relation to different semiconductor devices, different manufacturing batches, different processes, and/or different manufacturing equipment. Sample testing may be performed by a dedicated tester or by a plurality of dedicated testers. The number of samples taken will vary by design choice. In one embodiment, sample testing is conducted at room temperature as a "final test" after package of the semiconductor device. However, electrical testing across a temperature range may be performed. Further, sample testing may be performed during an electrical die sort (EDS) test, commonly performed after completion of a wafer containing multiple semiconductor dies. Alternately or additionally, module testing may be performed after incorporation of the semiconductor device into a module.

The test data obtained from the periodic sample testing is communicated from the constituent tester(s) to a server. The server then computes an error rate associated with each of the test items in the integrated test program and a characteristic distribution for each of the test items using conventionally understood statistical techniques (S300). Such statistical techniques will vary with application, but in one embodiment the statistical techniques are used to convert the test data associated with each test item characterizing the semiconductor device into a Gaussian distribution. Once a sufficiently large number of semiconductor devices have been tested (using a final test for example), the resulting test data may be statistically characterized (e.g., in relation to a Gaussian distribution), and then used to define an expected error rate.

The expected error rate for each test item may then be compared to reference data (S400). The reference data may be variously determined. For example, a quality control engineer may designate a certain value (or alternately, a threshold or range) as a minimum reference value for the semiconductor device. This type of reference value may correspond to a product quality guarantee may to a consumer.

If an expected error rate for a test item, as characterized in a Gaussian distribution, is lower (or substantially lower) than the corresponding reference data value, the test item may be omitted from subsequent test order files. (The test order file identifies the type and order of the test items run in an integrated test program). However, if the expected error rate is higher then (or sufficiently close to) the reference data value, the test item may be retained, added to, or expanded within a subsequent test order file. Alternatively, other test items closely related to (or implicated by) a specific test item result may be added to or deleted from a subsequent test order file.

In circumstances where an expected error rate for a test item is markedly higher than the reference data value, one or more test items may not only be added to a subsequent test order file, but also classified as a so-called "core measurement test item." Additional evaluation or modeling tools may be called into operation, such as the conventionally understood "Shmoo plot".

Thus, a possible result of the comparison between a computed expected error rate and a defined reference data value, test items may be added, deleted, re-ordered, expanded, etc., within a "new" test order file (S500). The new test order file may be used during subsequent "final test" batch testing for the semiconductor device. However, the new test order file may also or alternately be used to define other testing applied to the semiconductor device. For example, final test results may be used to modify a test order file defining an EDS test or a module test, or vice verses. In other words, test items contained in one type of test (or one level of testing within the overall manufacturing process) may be modified on the basis of characterizing test data for the semiconductor device obtained from a different type of test (or a different level of testing).

The exemplary method steps designed above in the illustrated embodiment as S300 through S500 may be performed by the server. Thus, a centralized test server may periodically and automatically optimize one or more test programs in real time. Customized software may be run on the server to implement methods of the invention, such as the on described above.

By automatically modifying an existing test order file to form a new test order file of similar format and syntax, updated test programs may be variously incorporated into the overall testing protocol for the semiconductor device without specific requirements to re-compile and re-install revised control software defining an updated test program. In contrast, a fairly simple approach may be used to introduce a modified test order file into the system. For example, in one embodiment, a variable flag method may be used. This particular programming technique, which is presented as one example of similarly effective techniques, will be described in some additional detail with reference to FIG. 3.

Following generation of a new test order file, the new test order file is combined into a corresponding test program or protocol of separate test programs to run subsequent batch testing on semiconductor devices (S600).

According to the foregoing exemplary method according to an embodiment of the invention, the new test order file generation and incorporation approach may be used to electrically test a large number of semiconductor devices while making periodic, real-time, modifications to one or more of the constituent test programs. Such modifications are based on empirically derived sample test data. Thus, the one or more test program is optimized in real-time in accordance with actual test data results accurately characterizing the semiconductor device. As a result, the potential for insufficient testing or testing overkill is significantly reduced, and overall productivity may be enhanced without risking product quality.

Figure 2:
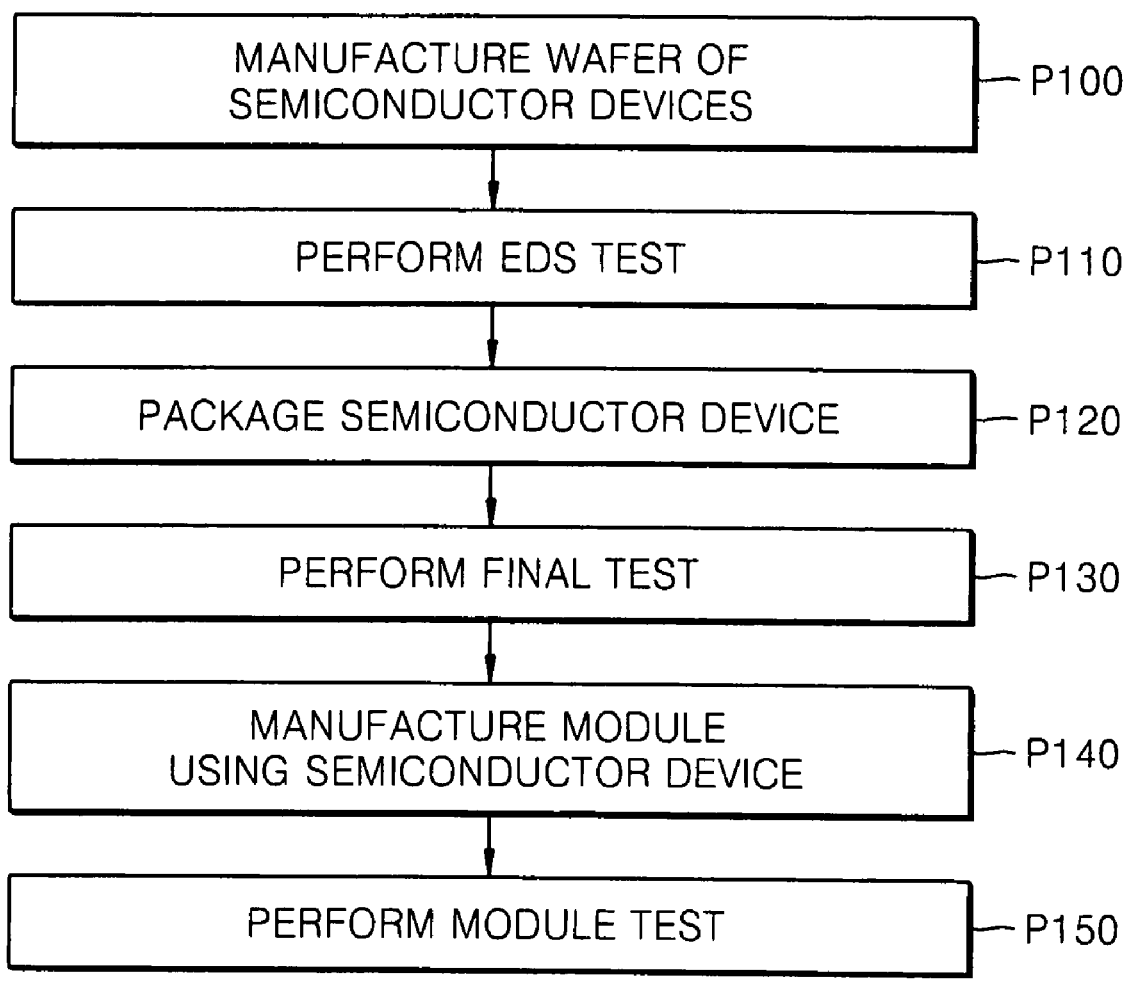
FIG. 2 is a flowchart summarizing a process of electrically testing of a semiconductor device.

FIG. 2 is a flowchart summarizing an exemplary testing protocol for a semiconductor device. This testing protocol includes multiple test programs run at different levels of the overall manufacturing process for the semiconductor device. Referring to FIG. 2, a wafer including a multiplicity of semiconductor devices is first fabricated using conventional processes (P100). This point in the overall manufacturing process is sometimes referred to as "wafer level." Hence, certain wafer leveling testing, such as an EDS test, is performed before individual semiconductor dies (or chips) are separated from the wafer for packaging (P110). For example, if the chips on the wafer will ultimately function as semiconductor memory devices, a cell repair test may be performed together with the EDS test, etc.

Following completion of wafer level testing, individual semiconductor dies are separated from the wafer and packaged in a form suitable for subsequent incorporation (or mounting) within a higher level subsystem or device (P120). Once packaged, the semiconductor device is subjected to final testing (P130). Thereafter, it is common for semiconductor devices to be mounted on a printed circuit board (PCB) or similar substrate as part of a subsystem or higher level module (P140). Thereafter, module testing is performed (P150). Of note, these various levels of testing may be run at different facilities by different manufacturing entities.

FIG. 3 is a table listing an exemplary set of test items for an integrated test program according to an embodiment of the invention. Referring to FIG. 3, the integrated test program includes test items identified in a characteristic classification column 110. The characteristic classification 110 may be subdivided into a set of subclasses (e.g., open/short detection, leakage characteristics, current characteristics, etc). Each subclass within the integrated test program may include a number of test items 112 more specifically directed to circuitry within the semiconductor device.

As indicated by column 114, the integrated test program includes (as indicated by the presence of an "O") all test items identified in column 112. In contrast, columns 116, 118, and 120 respectively indicate various sub-sets of the comprehensive collection of test items contained in the integrated test program associated with wafer level testing, package level testing, and module level testing. Omitted test items are indicated by the presence of an "X".

An EDS test is assumed for the wafer level testing for purposes of illustration. Column 116 does indicate various test items included in the EDS test. A test order may be indicated for the test items forming the EDS test. For example, the EDS test is performed in the listed order of (1), (3), (4), (5), (6), (7), (8), (10), (12), (14), (15), (16), (17), and (19). In its present configuration (as defined by an underlying test order file), the EDS omits test items (1), (9), (11), etc. However, test data obtained by periodic sample testing may indicate an expected error rate that exceeds certain reference data value(s). In such a circumstance, one or more of these omitted test items, or some additional test item, may be added to the EDS test. (This is similarly true for the package level and module level testing, the current state of each being reflected by columns 118 and 120 respectively).

Consider for example an assumed case where sample testing yields test data triggering an errant comparison with a reference data value related to certain short circuit testing (i.e., "SHORT-2" testing indicated as test item 2). This form of testing is currently omitted from the EDS test, but may be added setting a flag associated with test item 2, responding to the flag with the generation of a new test order file including this form of testing.

That is, each test item may be associated with a unique number, or flag variable, (e.g., (1) through (19) in the illustrated example). Each test item may be identified by its associated flag variable within the context and/or order of each test program. This type of programming technique is referred to as a flag variable method.

Figure 4:
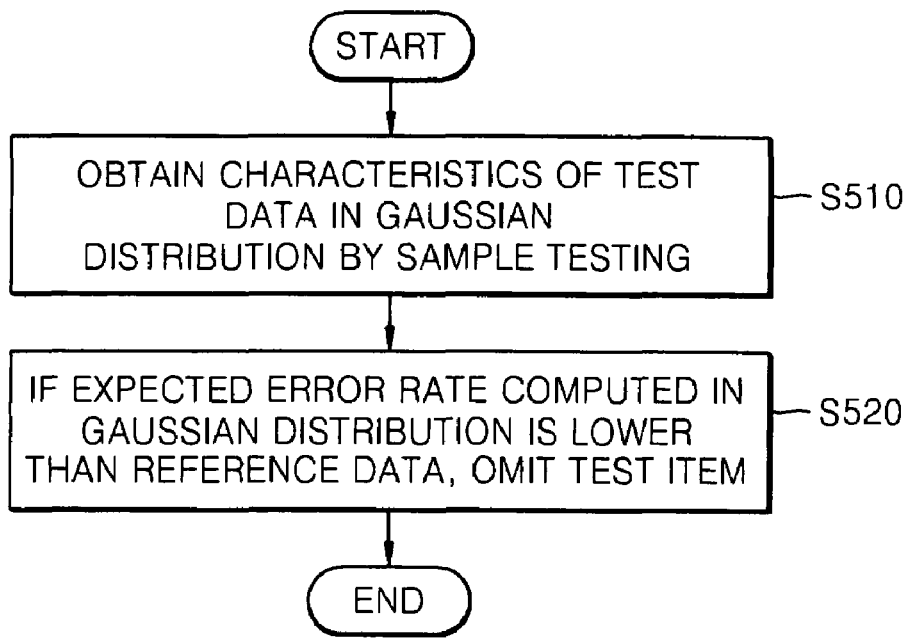
FIGS. 4 and 5 are flowcharts summarizing respective test program modification approaches drawn to the example illustrated in FIG. 1.
Figure 5:
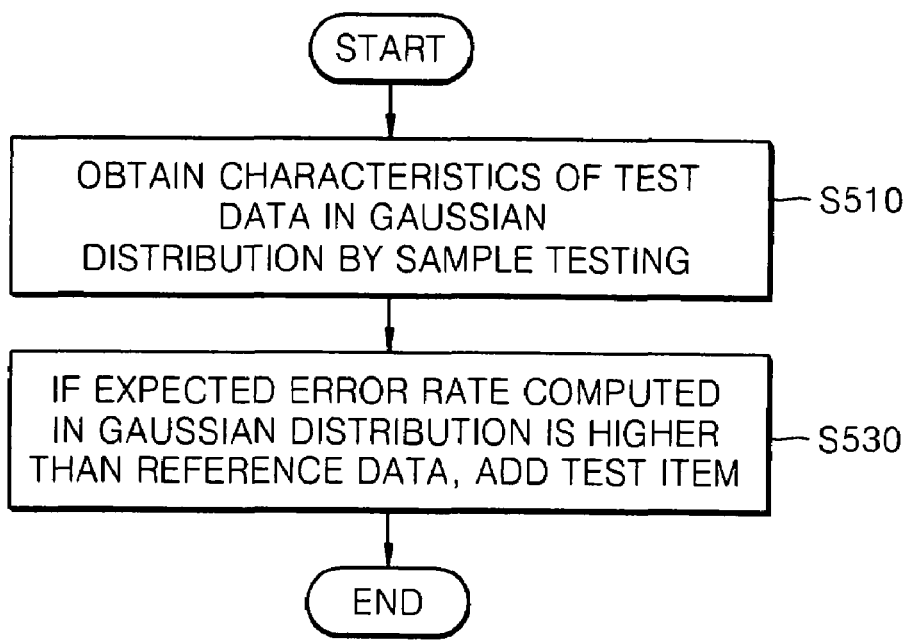

FIGS. 4 and 5 are additional flowcharts illustrating alternate methods for omitting or adding a test item to a test program, such as the one illustrated in FIG. 1. Referring to FIGS. 4 and 5, one periodic sample testing is completed, a test server connected to the constituent tester(s) receives test data and computes expected error rates. In the illustrated example, a conventional statistical technique is assumed and used to form a Gaussian distribution of the test data (S510). If such a statistical technique using a Gaussian distribution is utilized, an expected error rate may be computed for a large number of semiconductor devices.

If the expected error rate computed from the test data is lower than a corresponding reference data value, one or more test items may be omitted from the test program (S520). However, if the expected error rate is higher than the reference data value, one or more test items may be added to the test program (S530).

FIG. 6 is a general block diagram illustrating on possible configuration for a semiconductor device test system according to an embodiment of the invention. Referring to FIG. 6, the semiconductor device test system comprises a plurality of testers (#1, #2, ..., and #N) 100 variously testing a semiconductor device, and a server 102.

Server 102 may be used to load test program into the plurality of testers 100, as well as process and store test data received from the plurality of testers 100. Additionally, sever 102 may be used to implement method embodiments, in whole or in part, of the present invention.

FIG. 7 is a conceptual diagram illustrating in part an exemplary test order file within the context of the foregoing description. Individual test order files may have various structures depending on the exact nature of a related tester. Test order files may be generated in various high-level programming languages conventionally adapted to the implementation of semiconductor device testing.

Figure 8:
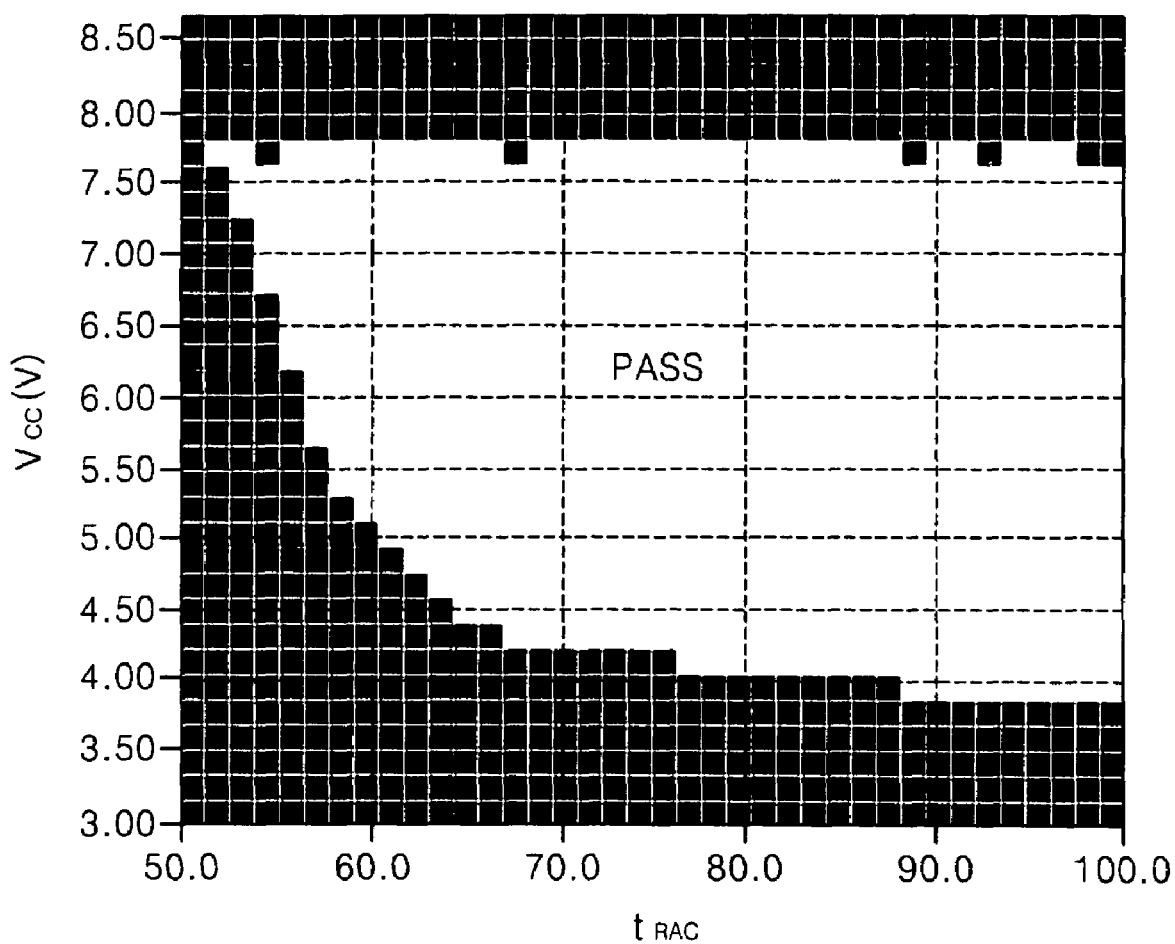
FIG. 8 is a corresponding Shmoo plot.

The exemplary test order file includes information designating a particular semiconductor device (e.g., a part type or number). Test conditions, testing location, a testing connection or layout, etc., may also be included in the test order file. Specific test items, including designated core measurement test items, may also be included in a prescribed sequence or set of sequences for various test programs (e.g., an integrated test program, wafer level test program, etc.). Test items and/or their order in each test program may be indicated using a unique flag variable provided by a variable flag method. Certain evaluation and modeling tools may be called for in a particular test order file. FIG. 8 shows an exemplary Shmoo plot for one specific test item. This type of additional testing evaluation data may be generated in relation to a designated core measurement test.

As described above, according to various embodiments of the invention, detected variations in the performance characteristics of a semiconductor device may be automatically accounted for in near real-time modifications of the underlying test protocol based upon actual test data derived by production sampling of the device. As a result, a better testing balance may be maintained—both insufficient testing and testing overkill may be avoided or minimized. Overall testing quality and testing time may be optimized across the range of test programs applied to the semiconductor device. Thus, productivity may be enhanced without loss of quality.

While the present invention has been particularly shown and described with reference to exemplary embodiments thereof, it will be understood by those of ordinary skill in the art that various changes in form and details may be made therein without departing from the scope of the present invention as defined by the following claims.

What is claimed is:

1. A method of testing a semiconductor device, comprising:

providing an integrated test program comprising a plurality of test items;

providing a test program defined by a sub-set of test items selected from the plurality of test items;

deriving test data by batch sample testing of the semiconductor device;

computing an error rate for one of the plurality of test items using the test data, and comparing the error rate to a reference data value;

on the basis of the comparison between the error rate and the reference data value, modifying the sub-set test items defining the test program in real-time.

2. The method of claim 1, wherein the test data is derived by batch sample testing of the semiconductor device using the integrated test program.

3. The method of claim 1, wherein the test program is defined by the sub-set of test items as indicated by a test order file.

4. The method of claim 3, modifying the sub-set of test items comprises omitting a test item from the test order file to form a new test order file, or adding an additional test item to the test order file to form a new test order file.

5. The method of claim 4, wherein formation of the new test order file and modification of the sub-set of test items defining the test program are accomplished without an additional requirement or recompilation.

6. The method claim 4, further comprising:

testing the semiconductor device using the test program as defined by the new test order file.

7. The method of claim 1, wherein the test program is a final test performed at a package level during the manufacture of the semiconductor device, an electrical die sort (EDS) test performed at a wafer level during the manufacture of the semiconductor device, or a module test performed following assembly of the semiconductor device onto a module.

8. The method of claim 7, wherein the final test and the batch sample testing are performed at room temperature.

9. The method of claim 1, wherein at least one of the sub-set of test items defining the test program is performed in relation to a Shmoo plot.

10. The method of claim 1, further comprising:

connecting a tester adapted to derive the test data to a server, wherein the tester is further adapted to run an automated test routine implementing the integrated test program; and computing the error rate using the server.

11. The method of claim 1, wherein batch sample testing of the semiconductor device is performed on a periodic basis.

12. The method of claim 1, wherein the semiconductor device is a memory device.

13. The method of claim 1, wherein the test order file comprises at least one core measurement test.

14. The method of claim 13, wherein the at least one core measurement test requires use of a Shmoo plot.

15. The method of claim 1, wherein the test program comprises a plurality of test programs, each uniquely defined by a respective sub-set of test items selected from the plurality of test items.

16. The method of claim 15, wherein a first test program in the plurality of test programs is a final test performed at a package level during the manufacture of the semiconductor device, a second test program in the plurality of test programs is an electrical die sort (EDS) test performed at a wafer level during the manufacture of the semiconductor device, and a third test program in the plurality of test programs is a module test performed following assembly of the semiconductor device onto a module.

17. A test system running software implementing a testing protocol for a semiconductor device, the test system comprising:

a server storing and executing the software to control a plurality of testers according to an automated test routine, each one of the plurality of testers being adapted to perform at least one electrical test on the semiconductor device, and the automated test routine implementing an integrated test program comprising a plurality of test items;

wherein the software implements a method of testing the semiconductor device comprising:

providing a plurality of test program, each uniquely defined by a respective sub-set of test items selected from the plurality of test items;

deriving test data by batch sample testing of the semiconductor device according to the integrated test program;

computing an error rate for one of the plurality of test items using the test data, and comparing the error rate to a reference data value;

on the basis of the comparison between the error rate and the reference data value, modifying at least one of the plurality of test programs in real-time.

18. The method of claim 17, wherein each one of the plurality of test programs is defined by the sub-set of test items as indicated by a corresponding test order file.

19. The method of claim 18, wherein modifying the at one test program comprises omitting a test item from the corresponding test order file to form a new test order file, or adding an additional test item to the corresponding test order file to form a new test order file.

20. The method of claim 19, further comprising:

testing the semiconductor device using the modified test program as defined by the new test order file.

* * * * *